(12) United States Patent
Hsieh et al.

(10) Patent No.: US 11,939,664 B2
(45) Date of Patent: Mar. 26, 2024

(54) SYSTEM AND METHOD FOR PERFORMING SEMICONDUCTOR PROCESSES WITH COATED BELL JAR

(71) Applicant: Taiwan Semiconductor Manufacturing Co., Ltd., Hsinchu (TW)

(72) Inventors: Meng-Chun Hsieh, Hsinchu (TW); Tsung-Yu Tsai, Hsinchu (TW); Hsing-Yuan Huang, Hsinchu (TW); Chih-Chang Wu, Hsinchu (TW); Szu-Hua Wu, Hsinchu (TW); Chin-Szu Lee, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 88 days.

(21) Appl. No.: 17/461,147

(22) Filed: Aug. 30, 2021

(65) Prior Publication Data

US 2023/0062902 A1 Mar. 2, 2023

(51) Int. Cl.
*C23C 14/34* (2006.01)
*C23C 14/50* (2006.01)
*H01L 21/677* (2006.01)
*H01L 21/687* (2006.01)

(52) U.S. Cl.
CPC .............. *C23C 14/50* (2013.01); *C23C 14/34* (2013.01); *H01L 21/67748* (2013.01); *H01L 21/68707* (2013.01)

(58) Field of Classification Search
CPC ......... C23C 14/50; C23C 14/34; C23C 14/22; C23C 16/045; C23C 16/34; C23C 16/4404; C23C 16/505; C23C 16/44; C23C 16/45544; C23C 16/4585; H01L 21/67748; H01L 21/68707; H01L 21/6719; H01L 21/02186; H01L 21/02164; H01L 21/02266; H01L 21/67017; H01L 21/67069
USPC .................................... 204/192.12
See application file for complete search history.

(56) References Cited

U.S. PATENT DOCUMENTS

| | | | |
|---|---|---|---|
| 6,777,045 B2 * | 8/2004 | Lin ................... | H01J 37/32458 118/723 VE |
| 2001/0003271 A1 * | 6/2001 | Otsuki ............. | C23C 16/45561 156/914 |
| 2002/0000374 A1 * | 1/2002 | Buchanan ........... | C23C 14/3407 204/298.11 |
| 2007/0032072 A1 * | 2/2007 | Sidhwa ............ | H01J 37/32871 438/653 |
| 2021/0057639 A1 * | 2/2021 | Ku ....................... | H01L 27/228 |

* cited by examiner

*Primary Examiner* — Rodney G Mcdonald
(74) *Attorney, Agent, or Firm* — Seed IP Law Group LLP

(57) ABSTRACT

A semiconductor process system includes a process chamber. The process chamber includes a wafer support configured to support a wafer. The system includes a bell jar configured to be positioned over the wafer during a semiconductor process. The interior surface of the bell jar is coated with a rough coating. The rough coating can include zirconium.

20 Claims, 12 Drawing Sheets

SYSTEM AND METHOD FOR PERFORMING SEMICONDUCTOR PROCESSES WITH COATED BELL JAR

BACKGROUND

There has been a continuous demand for increasing computing power in electronic devices including smart phones, tablets, desktop computers, laptop computers and many other kinds of electronic devices. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. These techniques can form very small features. However, there are many difficulties involved in ensuring high performance of the devices and features.

For example, in some cases unwanted contaminants such as stray particles or debris can fall onto the wafer during processing. These unwanted contaminants can cause detrimental effects to the function of integrated circuits formed in the wafer. The detrimental effects of contamination increase as the features formed in integrated circuits become smaller. Even small amounts of debris in sensitive layers or features can result in a total malfunction of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
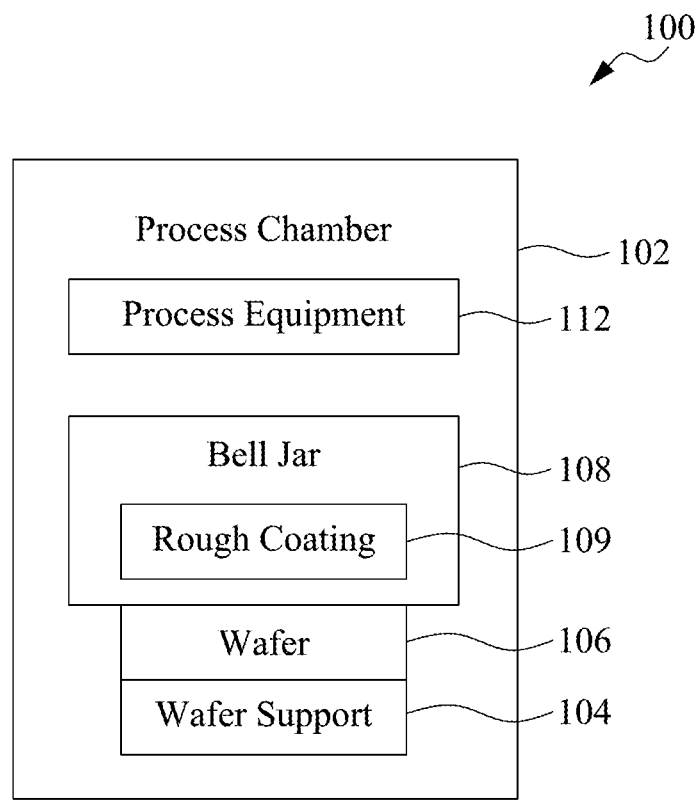
FIG. 1 is a block diagram of a semiconductor process system, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide a method and system for reducing contamination of wafers in a semiconductor process system. A wafer is supported within a semiconductor process chamber. A bell jar covers the wafer within the semiconductor process chamber. The interior surface of the bell jar is coated with a rough material. The rough material provides superior adhesion to particles or debris that are present within the semiconductor process system while a semiconductor process is performed. When the bell jar is used in a subsequent semiconductor process, the debris or particles from the previous semiconductor process do not fall off of the interior surface of the bell jar and fall onto the wafer because the particles or debris adhere tightly to the rough coating. The result is less contamination of wafers during semiconductor processes. This in turn leads to higher wafer yields and better functioning integrated circuits diced from the wafers.

FIG. 1 is a block diagram of a semiconductor process system 100, according to some embodiments. The semiconductor process system 100 includes a semiconductor process chamber 102. A wafer support 104 is positioned within the semiconductor process chamber 102. A wafer 106 is supported on the wafer support 104. A bell jar 108 is positioned over the wafer 106 within the semiconductor process chamber 102. As will be set forth in more detail below, the components of the semiconductor process system 100 cooperate to reduce contamination of the wafer 106 during semiconductor processes. Although the Figures and the corresponding description refer to a wafer 106, a substrate other than a wafer can be used. Accordingly a wafer is one example of a substrate that can be utilized in accordance with principles of the present disclosure. Substrates other than wafers can be used.

In some embodiments, the semiconductor process chamber 102 is configured to perform one or more semiconductor processes on the wafer 106. The wafer 106 is a semiconductor wafer. Typically, semiconductor wafers undergo a large number of processes during fabrication. These processes can include thin-film depositions, photoresist patterning, etching processes, dopant implantation processes, annealing processes, and other types of processes. After all of the processing steps are complete, the wafer 106 will be diced into a plurality of individual integrated circuits. As used herein, a "semiconductor process" can refer to any process performed on a semiconductor wafer, even if semiconductor materials are not involved in that particular process.

In some embodiments, the semiconductor process chamber 102 is a thin film deposition chamber. The thin-film deposition chamber can include a physical vapor deposition chamber, a chemical vapor deposition chamber, or an atomic layer deposition chamber, a plasma enhanced vapor deposition chamber, an epitaxial growth chamber. A chemical vapor deposition chamber can include a plasma enhanced chemical vapor deposition chamber or another type of chemical vapor deposition chamber. A physical vapor deposition chamber can include a sputtering chamber or another type of physical vapor deposition chamber. Those of skill in the art will recognize, in light of the present disclosure, that the semiconductor process chamber 102 can include a thin-film deposition chamber other than those described above without departing from the scope of the present disclosure.

In some embodiments, the semiconductor process chamber 102 is an etching chamber. The etching chamber is utilized to etch thin films deposited on the wafer 106. The etching chamber can include a chamber for wet etching, dry etching, plasma etching, or other types of etching processes. Etching chambers other than those described above can be utilized without departing from the scope of the present disclosure.

In some embodiments, the semiconductor process chamber 102 is a dopant implantation chamber. The dopant implantation chamber can include an ion implantation chamber in which the wafer 106 is bombarded with dopant ions. The dopant ions are implanted within the wafer 106 in accordance with selected parameters for the ion implantation process. The dopant implantation chamber can include types of dopant implantation other than those described above without departing from the scope of the present disclosure.

The semiconductor process chamber 102 includes processing equipment 112. The processing equipment 112 assists in performing the semiconductor processes. The processing equipment 112 can include equipment that assists in thin-film deposition processes, etching processes, ion implantation processes, annealing processes, photolithography processes, and other types of processes. Some of the processing equipment 112 may be positioned entirely within the semiconductor process chamber 102. Some of the processing equipment 112 may be positioned partially within the semiconductor process chamber 102 and partially external to the semiconductor process chamber 102. Some of the processing equipment 112 may be positioned entirely external to the semiconductor process chamber 102.

The processing equipment 112 can include electrical components for generating electric fields, voltages, magnetic fields, electrical signals, or other types of electrical effects. Accordingly, the processing equipment 112 can include electrodes, wires, radiofrequency power sources, transmitters, receivers, or other types of electrical equipment that may be utilized in semiconductor processes.

The processing equipment 112 can include equipment for managing gas or flow within the semiconductor process chamber 102. The processing equipment can include components for introducing gasses or fluids into the semiconductor process chamber 102, for removing gasses or fluids from the semiconductor process chamber, for monitoring and controlling the flow, presence, or composition of gasses within the process chamber 102.

As set forth previously, the bell jar 108 is placed over the wafer 106 during the semiconductor process. The bell jar 108 can perform multiple functions. For example, the bell jar can ensure that fluids or materials introduced into the environment of the wafer 106 remain in the vicinity of the wafer 106 during a semiconductor process. Additionally, the bell jar can prevent other fluids or materials from entering into the vicinity of the wafer 106 during a semiconductor process. The bell jar 108 can help maintain vacuum conditions.

While bell jars perform a very useful function, there also potential drawbacks associated with the bell jars. For example, during a thin-film deposition process materials are introduced into the environment of a wafer. These materials, in conjunction with the existing surface materials of the wafer and environmental conditions maintained by the semiconductor processing equipment, result in the deposition of a thin film on the surface of the wafer. Some of the deposition materials may adhere to the interior surface of the bell jar. During a subsequent deposition process, or another type of semiconductor process, these materials may come loose from the interior surface of the bell jar and may land on the surface of the wafer. These loosened materials from the previous process are now contaminants. The loosened material may include particles or debris. If the contaminants from the bell jar fall onto the wafer, then layers or features formed in the wafer may no longer perform their intended function. The integrated circuits diced from the wafer may function poorly or may not function at all.

One possible solution to reduce contamination from the interior of a bell jar is to coat the interior of the bell jar with a coating including aluminum. The coating may include alumina, such as aluminum oxide. A bell jar coated in aluminum may reduce certain kinds of contaminants. For example, when the aluminum coated bell jar is utilized in a deposition process for a dielectric layer, the materials utilized or produced in the deposition of the dielectric layer may adhere quite well with the aluminum coating. If the bell jar is then used in a subsequent semiconductor process, material or debris from the previous deposition process likely will not fall off and contaminate the wafer.

However, the materials from other types of deposition processes may not adhere well to the aluminum coating. For example, the materials utilized or produced during the deposition of some conductive materials may not adhere well to the aluminum coating. If an aluminum coated bell jar is utilized in the deposition of a metal layer, the materials utilized or produced during this deposition process may not strongly adhere to the aluminum coated bell jar. If the bell jar is then utilized in a subsequent process, then the material from the metal deposition process to become dislodged from the aluminum coating and may fall onto the wafer. This contamination of the wafer by materials from the metal deposition process may be highly disruptive to the function of integrated circuits formed in the wafer.

In a particular example, a via may be formed in a wafer. A conductive plug may subsequently be formed in the wafer. The conductive plug may be formed by first depositing a thin layer of titanium nitride followed by deposition of a conductive material, such as tungsten, that fills the rest of the via. During deposition of the titanium nitride layer, some of the titanium nitride or other materials utilized or produced in depositing the titanium nitride may adhere to the aluminum coating of the bell jar. The titanium nitride adheres relatively poorly to the aluminum coating. During the subsequent deposition of the tungsten plug material, some of the titanium nitride may become dislodged from the aluminum coating of the bell jar and fall onto the wafer. This contaminates the wafer and reduces the conductivity or negatively impacts other characteristics of the tungsten plug or other features in the wafer.

While some examples used herein portray debris falling from the aluminum coating onto the wafer during an immediately subsequent semiconductor process, in practice the debris may become dislodged after a large number of subsequent processes have been performed using the bell jar. The lifetime of the bell jar depends in part on the number of semiconductor processes that can be performed before contamination begins to occur due to unwanted debris or particles becoming dislodged from the bell jar.

The bell jar 108 of FIG. 1 includes a rough coating 109 on the interior surface of the bell jar 108. The rough surface of the rough coating 109 improves adhesion with materials used or produced during deposition of metal layers or other types of electrically conductive layers. The bell jar 108 including the rough coating 109 can be effectively utilized in conjunction with deposition of metals on the wafer 106. The deposition materials adhere well with the rough surface and, thus, will not become dislodged and contaminate the wafer 106 in subsequent semiconductor processes.

In one example, the bell jar 108 can be safely utilized for depositing multiple kinds of metal layers on the wafer 106. A first metal layer may be deposited as a thin barrier layer on the sidewalls of the trench or the. A second metal layer may then be deposited as a layer that fills the trench or the via. The materials associated with deposition of the first metal layer adhere tightly to the rough coating 109 of the bell jar 108. During deposition of the second metal layer, the material from the deposition of the first metal layer does not become dislodged from the rough coating 109 of the bell jar 108. Accordingly, there is no contamination of the wafer 106 from the bell jar 108 during deposition of the second metal layer.

In some embodiments, the first metal is titanium nitride. Titanium nitride particles adhere relatively poorly to a bell jar coated with aluminum. The titanium nitride particles adhere much better to the rough coating 109 of the bell jar 108. During deposition of the second metal, for example tungsten, the titanium nitride particles do not become dislodged from the rough coating 109 and did not contaminate the wafer 106 during deposition of the second metal. Other materials can be utilized for the first and second levels without departing from the scope of the present disclosure.

In practice, the rough coating 109 of the bell jar 108 increases the lifetime of the bell jar 108. In one example, a bell jar with an aluminum coating may have a lifetime of around 1000 cycles or processes before the risk of contamination becomes high. In some embodiments, the bell jar 108 with the rough coating 109 may have a significantly higher lifetime. For example, the bell jar 108 with the rough coating 109 may have a lifetime greater than 3000 cycles or semiconductor processes before significant risk of contamination.

In some embodiments, the bell jar 108 can be safely utilized for both dielectric deposition processes and metal deposition processes. For example, the bell jar 108 including the rough coating 109 can cover a wafer 106 during deposition of a first metal layer. The bell jar 108 including the rough coating 109 can be placed over a wafer 106 in a subsequent deposition process of a dielectric material. The metal particles will not become dislodged from the rough coating 109 during deposition of the dielectric material. Accordingly, the bell jar 108 including the rough coating 109 can be utilized for multiple types of alternating deposition processes without the risk of contaminating the wafer 106.

In some embodiments, the semiconductor process system 100 utilizes the bell jar 108 including a rough coating 109 for metal deposition processes and utilizes a second bell jar with a different coating for deposition of dielectric materials. The second bell jar may have an aluminum coating or other types of coating. During deposition of a dielectric material, the second bell jar is placed over the wafer 106. After deposition of the dielectric material, the second bell jar is removed and the bell jar 108 including the rough coating 109 is placed over the wafer 106. One or more metal deposition processes are then performed while the bell jar 108, including the rough coating 109, covers the wafer 106. The bell jar 108 and the second bell jar can be alternately swapped out in this manner when switching between dielectric deposition processes and metal deposition processes.

In some embodiments, the second bell jar is utilized for dielectric deposition processes taking place in a second process chamber separate from the process chamber 102. The wafer 106 may be placed in the second deposition chamber for deposition of a dielectric material. The second bell jar covers the wafer 106 during deposition of the dielectric material of the second deposition chamber. The wafer 106 is then transferred, for example by robotic arm, to the process chamber 102 for deposition of one or more metal layers. The bell jar 108 including the rough coating 109 is placed over the wafer 106 in the process chamber 102 during deposition of the first and second metal layers. The wafer 106 may be transferred back and forth between the process chamber 102 and the second process chamber for alternating dielectric and metal deposition processes.

While some particular examples have been given in which the process chamber 102 is a deposition chamber, the bell jar 108 including the rough coating 109 can be utilized in conjunction with processes other than deposition processes. For example, the bell jar 108 including the rough coating 109 can be utilized for etching processes, implantation processes, or epitaxial growth processes, and for other types of processes without departing from the scope of the present disclosure.

In some embodiments, the rough coating 109 is a zirconium coating. The zirconium coating can include pure zirconium, zirconium oxide, or other materials including zirconium. Embodiments described herein relate particularly to zirconium coatings. However, other materials can be used for the rough coating 109 without departing from the scope of the present disclosure. Such other materials for rough coating 109 include materials that exhibit an adhesion to materials to be deposited in a process chamber that is greater than an adhesion exhibited by aluminum to the materials to be deposited in the process chamber.

Further details regarding the rough coating 109 and related processes are provided in relation to subsequent figures.

Figure 2:
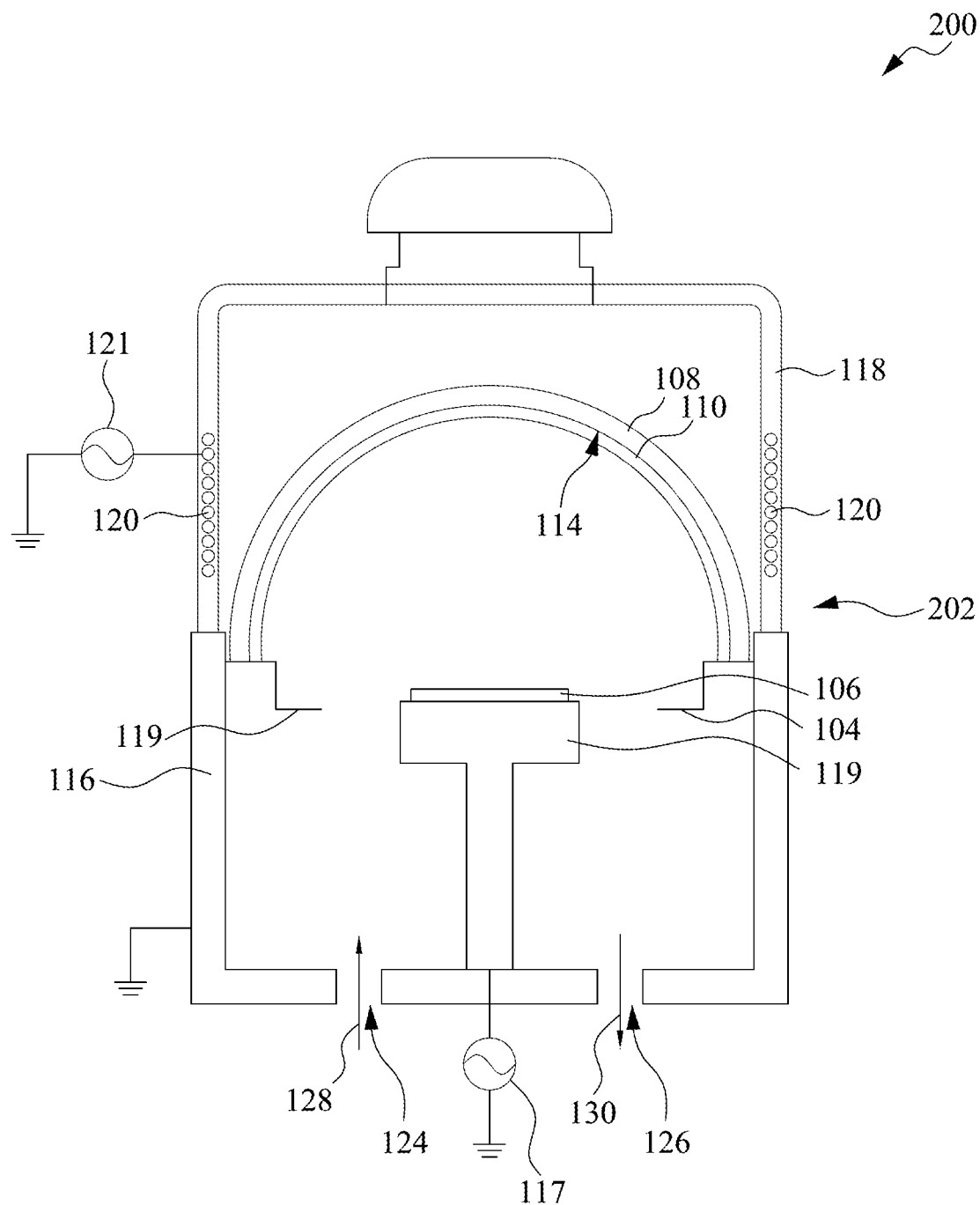
FIG. 2 is an illustration of a semiconductor process system in accordance with some embodiments.

FIG. 2 is an illustration of a thin-film deposition system 200, according to some embodiments. The thin-film deposition system 200 includes a deposition chamber 202. The thin-film deposition system 200 is one example of a semiconductor process system 100 of FIG. 1. The deposition chamber 202 is one example of a process chamber 102 of FIG. 1. The deposition chamber 202 includes a base 116 and a lid 118. When the lid 108 is positioned on the base 116, the lid and the base define an interior volume of the deposition chamber 202.

A wafer support 104 is positioned within the interior volume of the deposition chamber 202. The wafer support 104 may be coupled to the base 116. The wafer support 104 may include an electrostatic chuck or a vacuum chuck for supporting or holding the wafer 106 in place when the waitress placed on the wafer support 104. The wafer support 104 may also include one or more electrodes coupled to a radiofrequency voltage source 117 as will be described in more detail below.

A bell jar support 119 may be coupled to the base 116. The bell jar support 119 is configured to support a bell jar 108 during thin-film deposition processes. For example, after the wafer 106 is placed on the wafer support 104, the bell jar 108 may be lowered onto the bell jar support 119. The bell jar 108 is thus positioned over the wafer 106 during the thin-film deposition process. Further details regarding the bell jar 108 will be provided below.

The base 116 includes an inlet 124 and an outlet 126. During a thin-film deposition process, deposition materials 128 or precursors are flowed into the deposition chamber 102. The deposition materials 128 can include materials that will result in the deposition of a thin film on the wafer 106. After the deposition process, exhaust materials 130 are removed from the deposition chamber 202 via the outlet 126. The exhaust materials 130 can include unused deposition materials, byproducts of the deposition process, or purging fluids. The purging fluids can include inert gases such as molecular nitrogen or argon that are flowed into the deposition chamber 202 and carry remaining deposition materials 128 and deposition byproducts or other exhaust materials from the deposition chamber 202 via the outlet 126. In practice, the inlet 124 and outlet 126 may be configured are positioned differently than shown in FIG. 2 without departing from the scope of the present disclosure.

In one example, the deposition chamber 202 is a physical vapor deposition chamber. As such, the lid 118 includes a radiofrequency coil 120 coupled to a radiofrequency voltage source 121. The physical vapor deposition process can include a sputtering process. During the sputtering process, voltages are applied between the radiofrequency coil 120 and an electrode positioned within the wafer support 102. While the voltages are applied, deposition materials 128 are flowed into the deposition chamber 202. The bell jar 108 helps maintain the deposition materials 128 in close proximity to the wafer 106 during the deposition process. In some embodiments, the base 116 is grounded during the deposition process.

In some embodiments, the sputtering processes utilized to deposit metal layers on the wafer 106. In one example, the sputtering process is used to deposit a thin layer of titanium nitride on the sidewalls of a trench or via formed in the wafer 106. A subsequent sputtering process, or other type of deposition process can be utilized to deposit a second metal layer of a different material. Other types of deposition processes and materials can be utilized without departing from the scope of the present disclosure.

The bell jar 108 includes an interior surface 114. The interior surface 114 is the surface proximal to the wafer 106. An exterior surface of the bell jar 108 corresponds to a surface proximal to the lid 118 and distal to the wafer 106. The interior surface 114 is coated with a zirconium coating 110. The zirconium coating 110 is one example of the rough coating 109 of FIG. 1. The zirconium coating 110 may have a thickness between 100 nm and 5 mm. This range of thicknesses can provide a sufficient amount of Zirconium to result in a rough surface to which deposition metals can tightly adhere without falling off. As will be set forth in more detail below, a higher root mean square surface roughness can result in better capture or adhesion of deposition materials. The zirconium coating with these thicknesses may provide the desired surface roughness, though other thickness may also be used. The zirconium coating 110 may be deposited by physical vapor deposition, chemical vapor deposition, by atomic layer deposition, or by any other suitable deposition process. Other thicknesses and deposition processes can be utilized for the zirconium coating 110 without departing from the scope of the present disclosure.

In some embodiments, the bell jar 108 can be safely utilized for depositing multiple kinds of metal layers on the wafer 106. A first metal layer may be deposited as a thin barrier layer on the sidewalls of a trench or via formed in the wafer 106. A second metal layer may then be deposited as a layer that fills the trench or the via. The materials associated with deposition of the first metal layer adhere tightly to the rough zirconium coating 110 of the bell jar 108. During deposition of the second metal layer, the material from the deposition of the first metal layer does not become dislodged from the rough zirconium coating 110 of the bell jar 108. Accordingly, there is no contamination of the wafer 106 from the bell jar 108 during deposition of the second metal layer.

In some embodiments, the first metal is titanium nitride. Titanium nitride particles adhere relatively poorly to a bell jar coated in aluminum. The titanium nitride particles adhere much better to the rough zirconium coating 110 of the bell jar 108. During deposition of the second metal, for example tungsten, the titanium nitride particles do not become dislodged from the rough zirconium coating 110 and the not contaminate the wafer 106 during deposition of the second metal. Other materials can be utilized for the first and second levels without departing from the scope of the present disclosure. A thin-film deposition system 200 can have configurations and components other than those described in relation to FIG. 2 without departing from the scope of the present disclosure.

Figure 3:
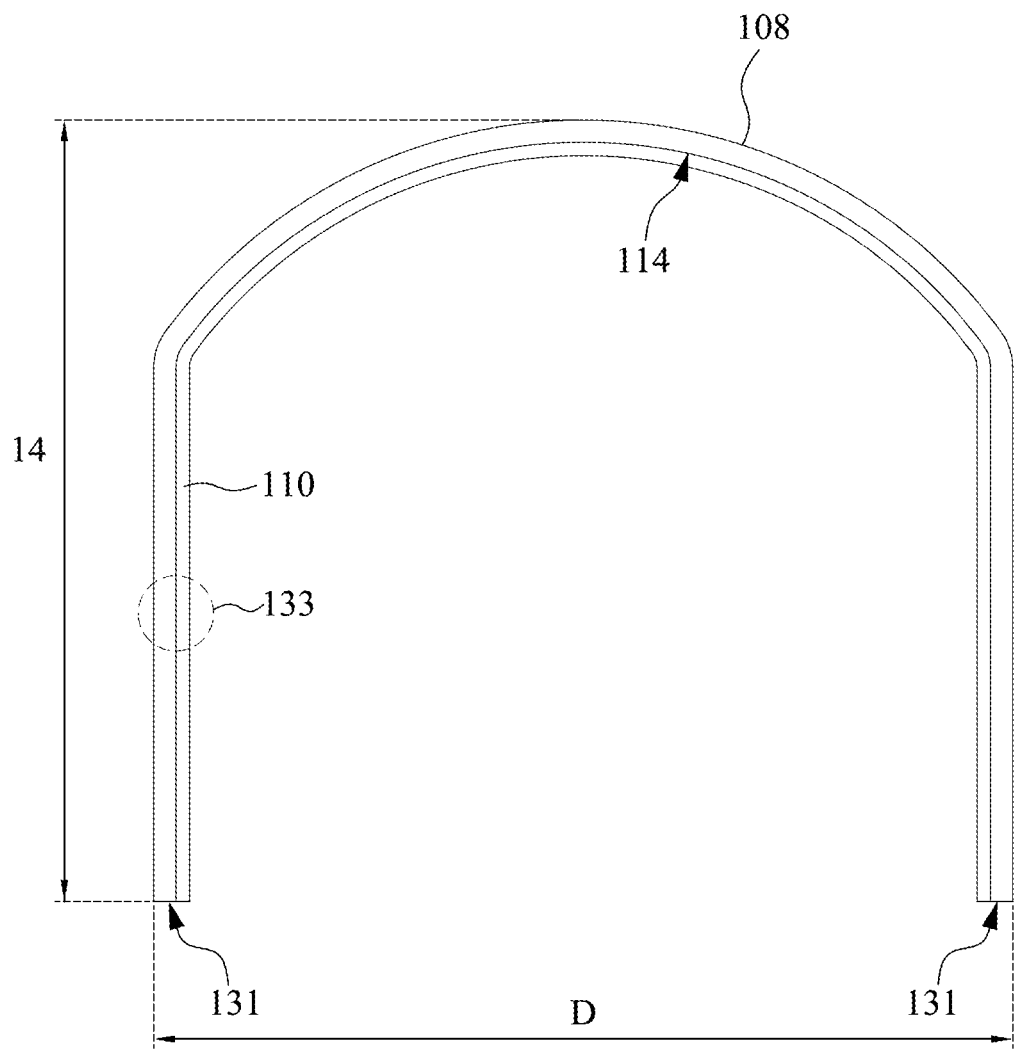
FIG. 3 is an illustration of a bell jar of a semiconductor process system, in accordance with some embodiments.

FIG. 3 is an illustration of a bell jar 108, according to some embodiments. The bell jar 108 is one example of a bell jar 108 of FIGS. 1 and 2. In some embodiments, the bell jar 108 is made of quartz. The bell jar 108 may be made of other materials that are highly durable, that can withstand high temperatures, that can withstand vacuum conditions, and that can withstand other conditions that may be associated with semiconductor processes.

The bell jar 108 has an interior surface 114. A zirconium coating 110 is positioned on the interior surface 114 of the bell jar 108. The zirconium coating 110 can have thicknesses, deposition processes, and other characteristics as described previously in relation to FIGS. 1 and 2.

The bell jar 108 has a circular horizontal cross-section. Accordingly, a bottom surface 131 of the bell jar 108 is substantially circular. When the bell jar is placed on the bell jar support 119 of FIG. 2, the bottom surface 130 of the bell jar 108 encircles the wafer 106. The bell jar 108 has a diameter D. The diameter D corresponds to the outer diameter of the bottom surface 131. The diameter D can be between 35 cm and 100 cm. The bell jar 108 has a height H. The height H is between 35 cm and 150 cm. The bell jar 108 can have other dimensions and shapes without departing from the scope of the present disclosure.

Figure 4A:
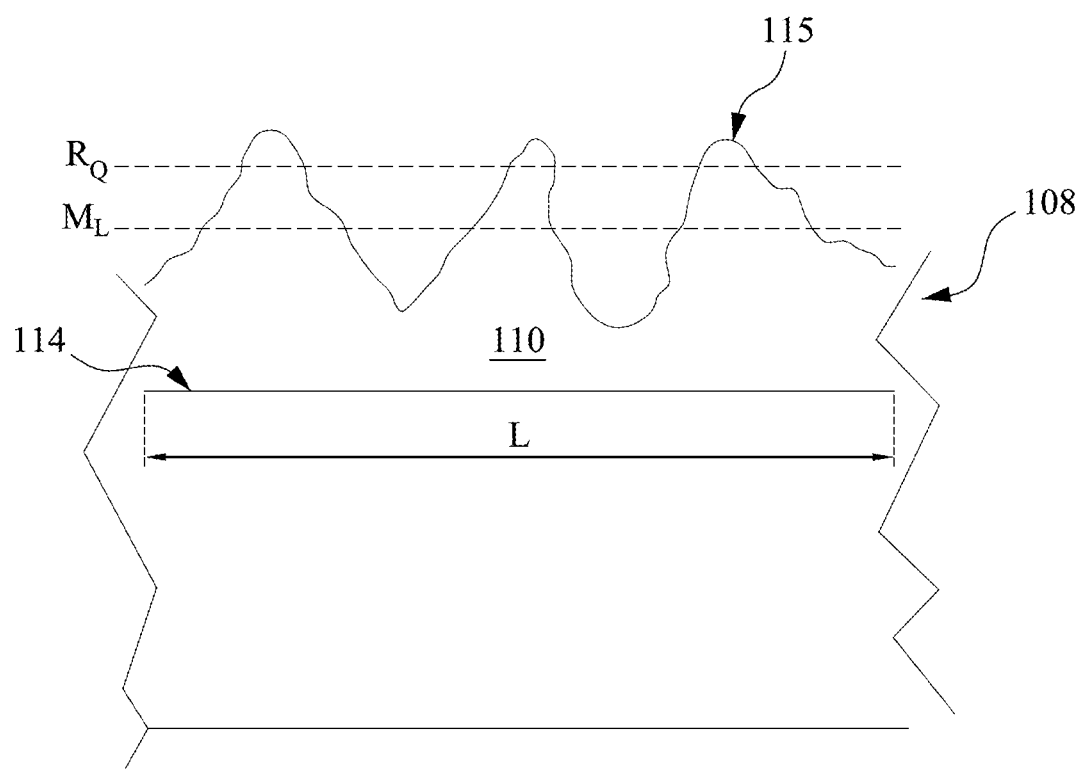
FIG. 4A is an illustration of surface roughness of the bell jar, in accordance with some embodiments.
Figure 4B:
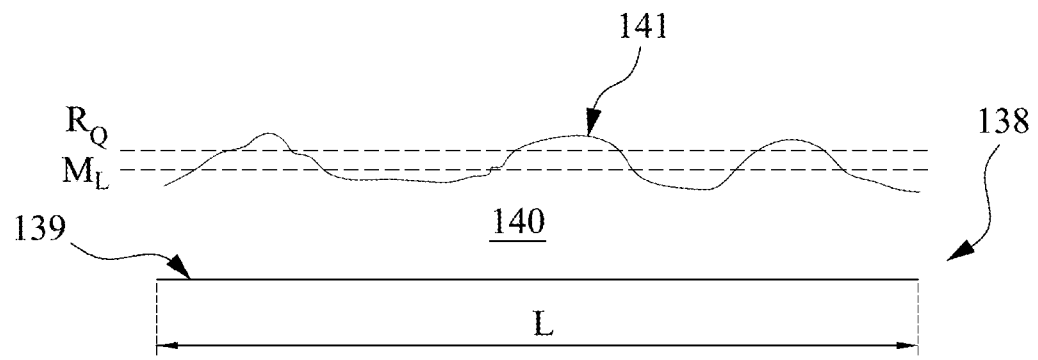
FIG. 4B is an illustration of surface roughness of a bell jar, in accordance with some embodiments.

FIG. 4A is an enlarged cross-sectional view of a bell jar 108, according to some embodiments. The enlarged view corresponds to the dashed circle 133 of FIG. 3. The view of FIG. 4A has been rotated 90° counterclockwise relative to the orientation of FIG. 3 for ease of illustration. The bell jar 108 includes the interior surface 114 coated with the zirconium coating 110. FIGS. 4A and 4B are utilized to illustrate a difference in surface roughness between the zirconium coating 110 and an aluminum coating 140 (see FIG. 4B).

Unless stated otherwise, as used herein, roughness values are given as root mean square (RMS) roughness values, though other types of roughness values can be used. For example, roughness can be given as the arithmetical mean deviation of an assessed surface profile, as a maximum valley depth of the assessed surface profile, the maximum peak height of the assessed surface profile, the skewness of the assessed surface profile, the kurtosis of the assessed surface profile, or the average distance between the highest peak and lowest valley in each sampling length. Those of skill in the art will recognize, in light of the present disclosure, that while RMS roughness is used herein, various other surface roughness assessments can be utilized without departing from the scope of the present disclosure.

The view of FIG. 4A illustrates that a surface 115 of the zirconium coating 110 includes various peaks and valleys. The heights and depths of the peaks and valleys as shown in FIG. 4A may not correspond to an accurate representation of the surface 115 of the zirconium coating 110. However, the view of FIG. 4A is helpful in illustrating the principle of surface roughness and, in particular, RMS roughness.

In FIG. 4A, a mean line ML is illustrated. The mean line ML corresponds to the mean height of the top surface 108 when all peaks and valleys are taken into account along the sampling length L. Accordingly, the mean line ML is at a height between the highest peak and the lowest valley of the surface 115 of the coating of the zirconium coating 110.

The RMS roughness is represented by the line RQ in FIG. 4A. The RMS roughness RQ is calculated by taking a number of height measurement samples relative to the mean line ML. Heights that are greater than the mean line ML have a positive value. Heights that are lower than the mean line ML have a negative value. Each of the individual height measurements is squared. The squares of all the height measurements are summed and divided by the number of samples. The square root of this value is the RMS roughness RQ and has units of distance. Accordingly, a RMS roughness of 2 nm means that the line RQ is 2 nm above the mean line ML. A larger RMS roughness value indicates a rougher surface. Unless specified otherwise, roughness values provided herein correspond to RMS roughness values.

The RMS roughness of the zirconium coating 110 depends, in part, on the size of zirconium grains that formed during the deposition process. The size of the zirconium grains is based, in part, on the type of deposition process. Atomic layer deposition processes may result in smaller grain sizes for zirconium than physical vapor deposition processes. Electroless and spray on coating processes may result in relatively large grain sizes. The roughness of the zirconium coating 110 may also depend, and part, on the roughness of the interior surface 114 of the bell jar 108. Various deposition processes and deposition parameters may be selected for depositing the zirconium coating 110. In some embodiments, the zirconium coating 110 has an RMS roughness greater than 10 nm. In some embodiments the zirconium coating 110 has an RMS roughness greater than 50 nm. In some embodiments, the zirconium coating 110 has an RMS roughness greater than 500 nm. The zirconium coating 110 can have other RMS roughness values without departing from the scope of the present disclosure.

More generally, the zirconium coating 110 can be replaced with a rough coating 109 of a different suitable material with similar or higher roughness and adhesion properties, without departing from the scope of the present disclosure.

FIG. 4B illustrates an enlarged cross-sectional view of a second bell jar 138, according to some embodiments. The second bell jar 138 has an interior surface 139. The interior surface 139 is coated with an aluminum coating 140. As can be seen from FIGS. 4B and 4A, the roughness of the surface 141 of the aluminum coating 140 is significantly less than the roughness of the zirconium coating 110 of the bell jar 108. Said another way, the aluminum coating 140 is much smoother than the zirconium coating 110. In some embodiments, the aluminum coating has an RMS thickness less than 2 nm.

Figure 5:
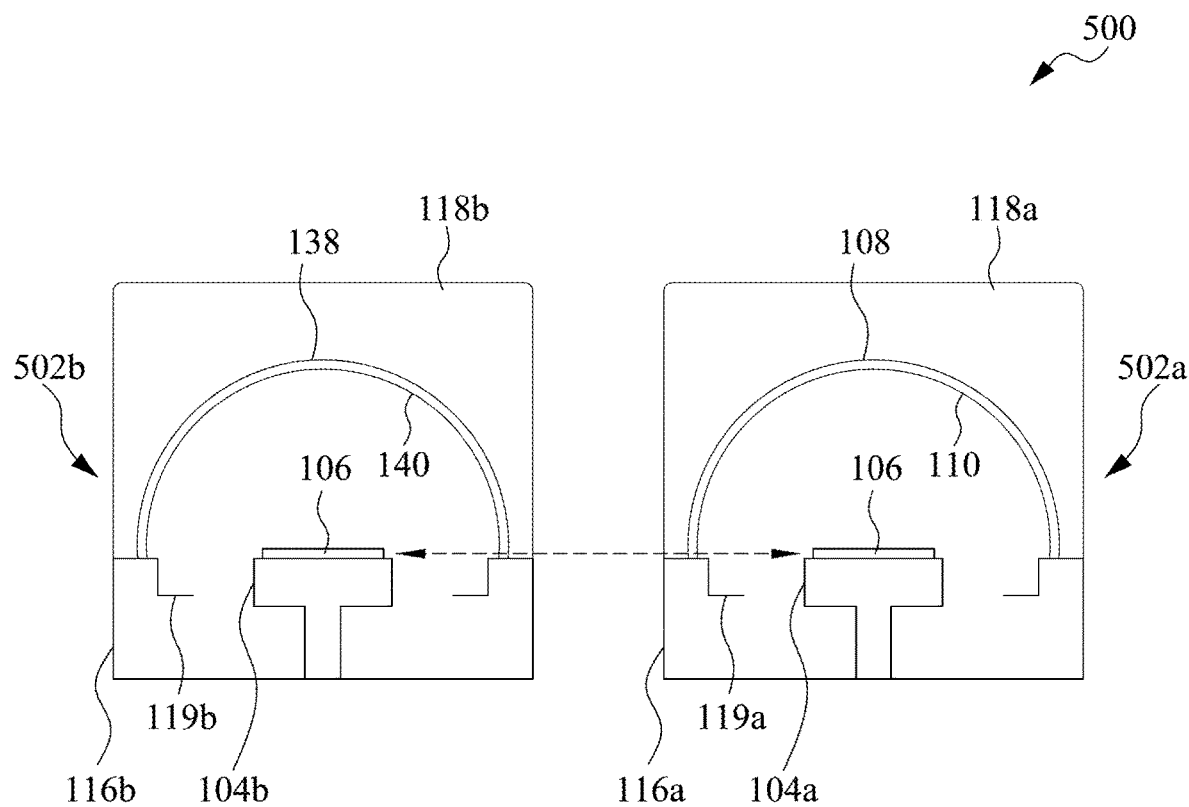
FIG. 5 is an illustration of a semiconductor process system including multiple semiconductor process chambers, in accordance with some embodiments.

FIG. 5 a thin-film deposition system 500, according to some embodiments. The thin-film deposition system 500 includes a first deposition chamber 502a and a second deposition chamber 502b. The first deposition chamber 502a may be substantially similar to the first deposition chamber 202a of FIG. 2. The first deposition chamber 502a includes a base 116a coupled to a lid 118a. A wafer support 104a supports a wafer 106. A bell jar support 119a supports a bell jar 108. The bell jar 108 is coated with a zirconium coating 110.

The second deposition chamber 502b includes a base 116b coupled to a lid 118b. A wafer support 104b supports a wafer 106. A bell jar support 119b supports a bell jar 138. The bell jar 138 is coated with an aluminum coating 140.

In some embodiments, the first thin-film deposition chamber 502a is utilized to deposit metal layers on the wafer 106. For example, the first thin-film deposition chamber 502a may be utilized to deposit titanium nitride layers, tungsten layers, copper layers, aluminum layers, tantalum layers, or other metal layers. In some embodiments, the second thin-film deposition chamber 502b may be utilized to deposit dielectric layers. For example, the second thin-film deposition chamber 502b may be utilized to deposit silicon oxide, silicon nitride, TEOS, silicon carbide, or other dielectric layers. The bell jar 138 including the aluminum coating 140 is utilized for the deposition of dielectric layers in the deposition chamber 502b. The bell jar 108 including the zirconium coating 110 is utilized for the deposition of metal layers in the deposition chamber 502a. A robot arm or other transfer mechanism may transfer the wafer 106 between the first deposition chamber 502a and the second deposition chamber 502b for various metal and dielectric deposition processes.

Figure 6:
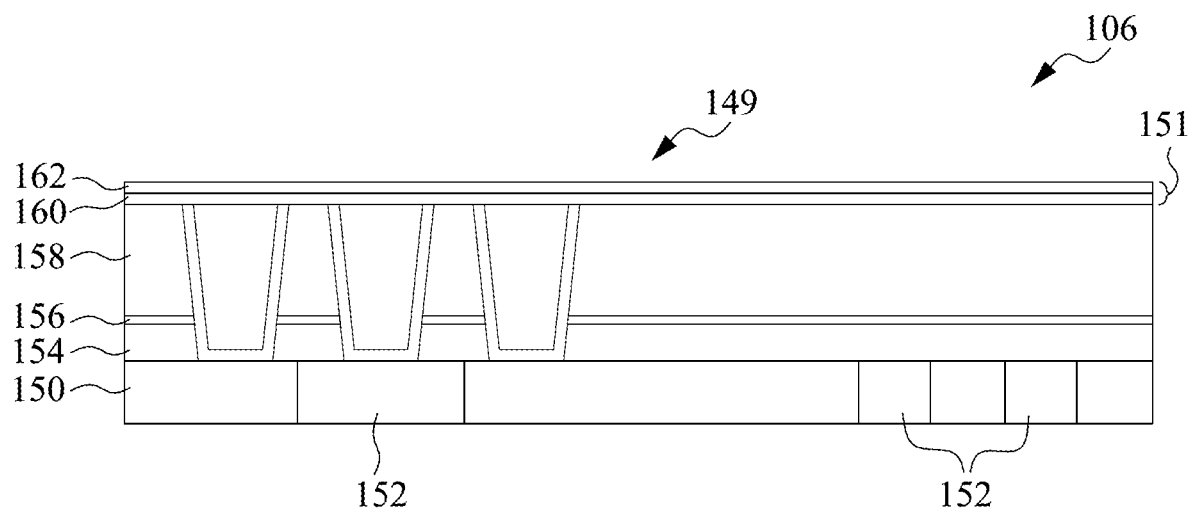
FIG. 6 is a cross-section of a wafer, in accordance with some embodiments.

FIG. 6 is a cross-sectional view of a wafer 106, according to some embodiments. The wafer 106 is at an intermediate processing stage of a metal tunnel junction 151 of a magnetic random access memory cell (MRAM). The wafer 106 includes dielectric layers 150, 154, 156, and 158. Conductive structures 152 are formed in the dielectric layer 150.

The magnetic tunnel junction 151 includes a first metal layer 160 and the second metal layer 162. In one example, the first metal layer includes titanium nitride. In one example, the second metal layer 162 includes tantalum nitride. The second layer 162 corresponds to a magnetic tunnel junction of the MRAM cell 149. The first metal layer 160 and the second metal layer 162 may be deposited in the deposition chamber 202 of FIG. 2. More particularly, the bell jar 108 including the zirconium coating 110 may be placed over the wafer 106 during deposition of the first metal layer 160 and the second metal layer 162. Continuing with the example in which the first metal layer 160 includes titanium nitride, titanium nitride deposition byproducts adhere tightly to the zirconium coating 110. During deposition of the second metal layer the titanium nitride deposition byproducts do not fall off of the zirconium coating 110 of the bell jar 108 onto the wafer 106. The result is that the magnetic tunnel junction and the MRAM cell 149 function properly. The metal layers 160 and 162 may include other materials than those described above without departing from the scope of the present disclosure.

The wafer 106 includes conductive vias 165 formed in the dielectric layers 158, 156, and 154. Some of the conductive vias 165 may electrically connect the metal layer 162 to one or more electrical structures 152. The conductive vias 165 may include titanium nitride barrier layers and tungsten or copper metal fill material. The metal materials of the conductive vias 165 may be deposited while covered by the bell jar 108 including the zirconium coating 110. The conductive vias 165 may have other materials than those described above without departing from the scope of the present disclosure.

In one example, the dielectric layer 150 may include silicon oxide. The dielectric layer 154 is a silicide blocking layer (SBL) and may include silicon carbide or another suitable material. The dielectric layer 156 may include aluminum oxide. The dielectric layer 158 may include silicon oxide. Other materials can be utilized for the dielectric layers 150, 154, 156, and 158 without departing from the scope of the present disclosure.

In some embodiments, the dielectric layers 150, 154, 156, and 158 may be deposited while the bell jar 108 is positioned over the wafer 106. The dielectric layers 150, 154, 156, and 158 may be deposited in the same deposition chamber as the metal layers 160 and 162. Alternatively, the dielectric layers 150, 154, 156, and 158 may be deposited in a separate deposition chamber from the metal layers 160 and 162 while covered with the bell jar 108.

In some embodiments, the dielectric layers 150, 154, 156, and 158 may be deposited while bell jar 138 is positioned over the wafer 106. The, the dielectric layers 150, 154, 156, and 158 may be deposited in a separate deposition chamber from the metal layers 160 and 162 while covered with the bell jar 138.

Figure 7:
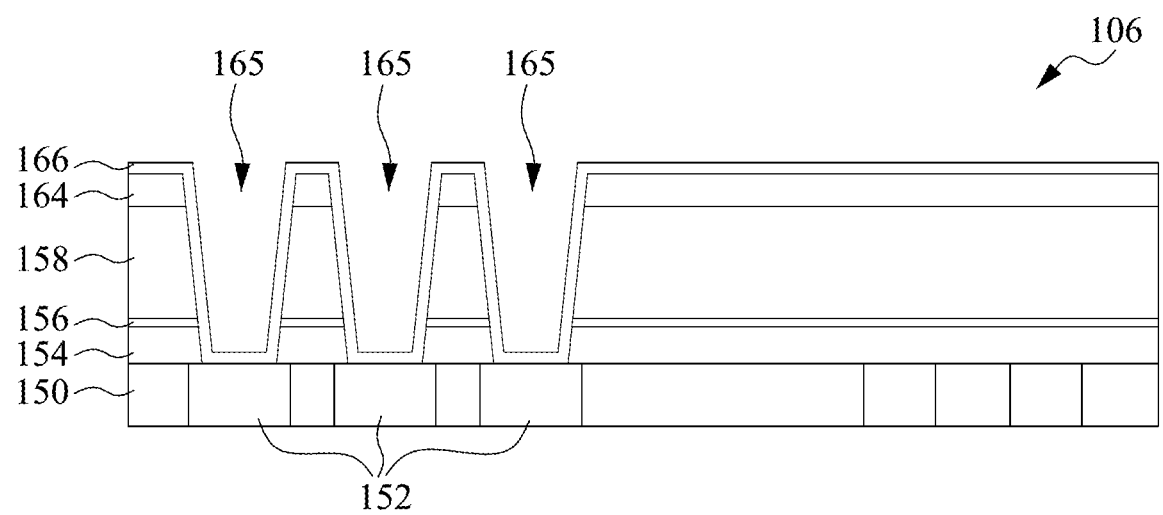
FIG. 7 is a cross-section of a wafer, in accordance with some embodiments.

FIG. 7 is a cross-sectional view of a wafer 106, according to some embodiments. The wafer 106 is at an intermediate processing stage of metal interconnects for logic transistors. The wafer 106 includes dielectric layers 150, 154, 156, 158, and 164 and. Conductive structures 152 are formed in the dielectric layer 150.

In the example of FIG. 7, conductive vias 165 are at an intermediate stage of processing. The vias have been opened and a conductive material 166 has been formed on the dielectric layer 164 and on the sidewalls of the vias. In some embodiments, the layer 166 is titanium nitride deposited in the presence of the bell jar 108. Following deposition of the titanium nitride, a copper seed layer may be deposited on the barrier layer 166. The copper fill material may then be deposited on the copper seed layer to fill the conductive vias 165. Other materials to be utilized for the conductive vias without departing from the scope of the present disclosure. Because the metal layers are deposited in the presence of the bell jar 108, titanium nitride or other debris does not fall onto the copper seed layer or the other layers utilized to form the conductive vias 165.

In one example, the dielectric layer 150 may include silicon oxide. The dielectric layer 154 is a silicide blocking layer (SBL) and may include silicon carbide or another suitable material. The dielectric layer 156 may include aluminum oxide. The dielectric layer 158 may include silicon oxide. The dielectric layer 164 may include a nitrogen free antireflective coating (NFARC) such as silicon carbide. Other materials can be utilized for the dielectric layers 150, 154, 156, and 158 without departing from the scope of the present disclosure.

In some embodiments, the dielectric layers 150, 154, 156, 158, and 164 may be deposited while the bell jar 108 is positioned over the wafer 106. The dielectric layers 150, 154, 156, 158, and 164 may be deposited in the same deposition chamber as the metal layer 166 and the other metal layers associated with the conductive vias 165. Alternatively, the dielectric layers 150, 154, 156, and 158 may be deposited in a separate deposition chamber from the metal layers.

In some embodiments, the dielectric layers 150, 154, 156, 158, and 164 may be deposited while bell jar 138 is positioned over the wafer 106. The, the dielectric layers 150, 154, 156, 150, and 164 may be deposited in a separate deposition chamber from the metal layers while covered with the bell jar 138.

The wafer 106 can include other structures, materials, deposition processes without departing from the scope of the present disclosure.

Figure 8:
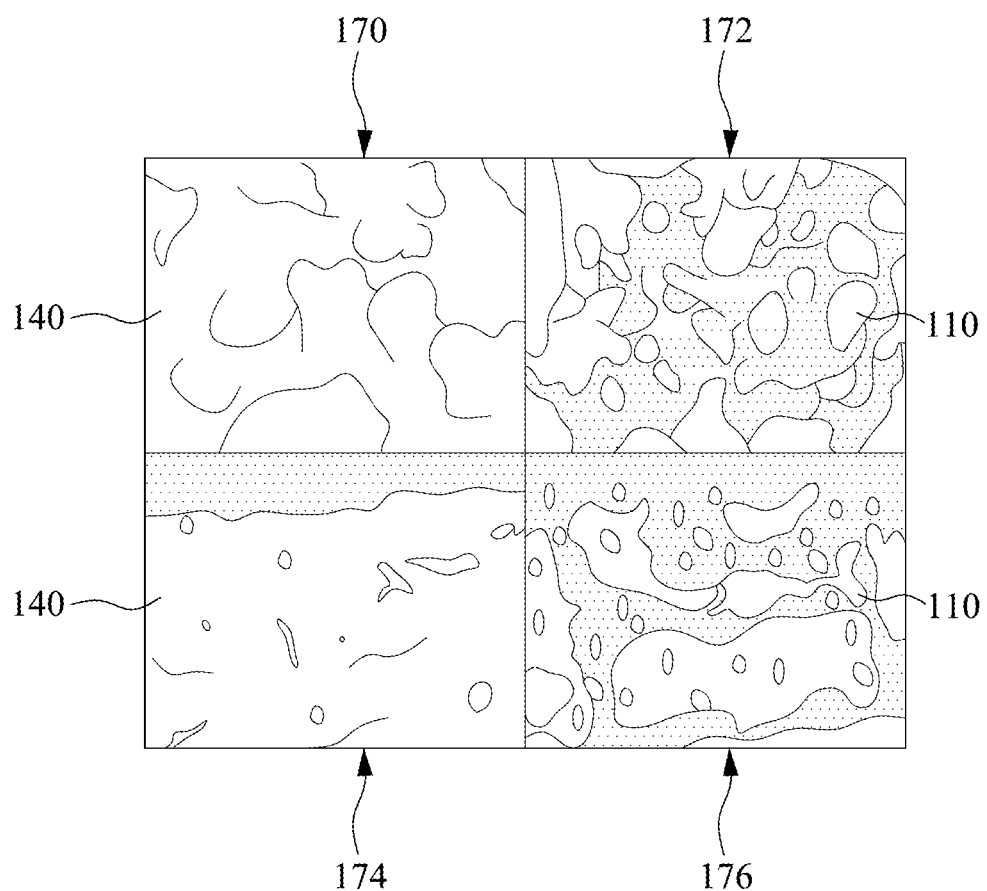
FIG. 8 includes illustrations of bell jar coatings, in accordance with to some embodiments.

FIG. 8 includes a plurality of illustrations 170, 172, 174 and 176 of bell jar coatings, according to some embodiments. Illustration 170 is a top view of an aluminum coating 140 of a bell jar 138. Illustration 172 is a top view of a zirconium coating 110 of a bell jar 108. The illustrations 170 and 172 illustrate that the zirconium coating 110 is significantly rougher than the aluminum coating 140 and hence provides better adhesion with the titanium nitride or other metals deposited in the presence of the bell jar 108.

Illustration 174 is a cross-sectional view of an aluminum coating 140 of a bell jar 138. Illustration 176 is a cross-sectional view of a zirconium coating 110 of a bell jar 108. The illustrations 174 and 176 illustrate that the zirconium coating 110 is significantly rougher than the aluminum coating 140.

Figure 9:
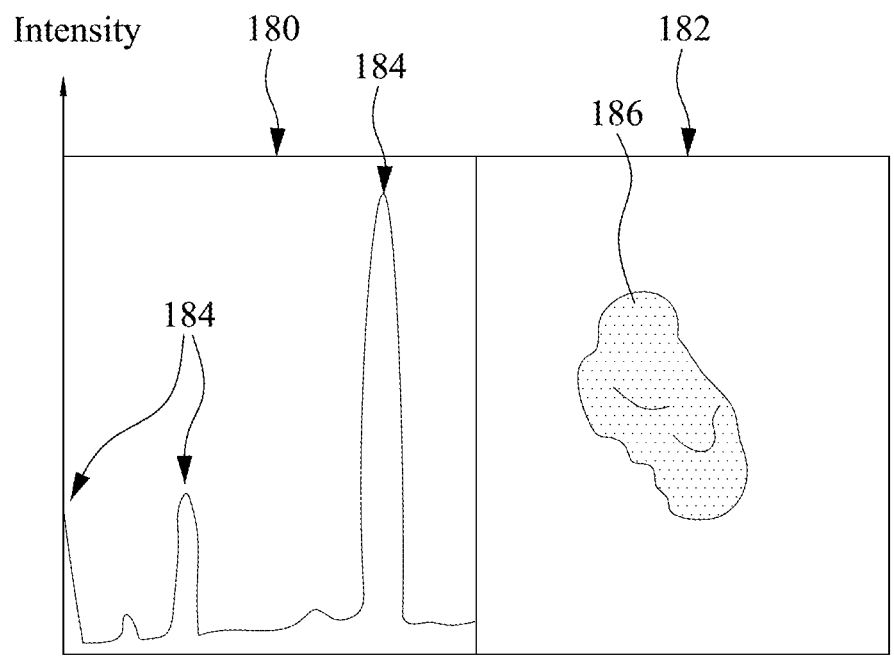
FIG. 9 is an illustration of spectrometer peaks and an illustration of debris dislodged from a bell jar, in accordance with some embodiments.

FIG. 9 includes a graph 180 and an illustration 182, according to some embodiments. The illustration 182 includes a debris particle 186 that has become dislodged from a bell jar and landed on a wafer. The graph 180 is an emission spectrum. The peaks and emission spectrum corresponds to the intensity of emissions at various wavelengths. Each of the wavelengths is associated with a material. The peaks 184 in FIG. 9 may correspond to one or more of oxygen, carbon, silicon, titanium, nitrogen, or other materials depending on the material of the debris particle 186.

Figure 10:
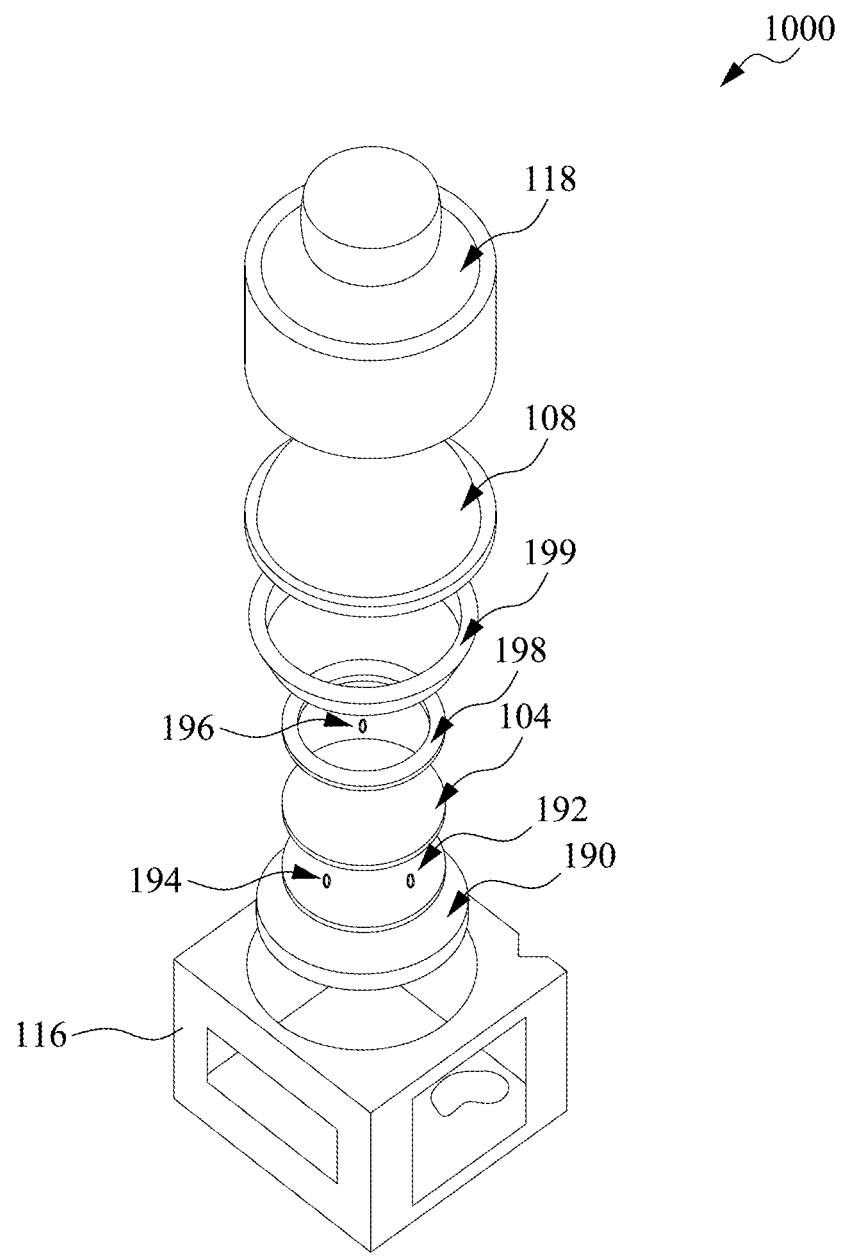
FIG. 10 is an exploded view of a semiconductor process system, in accordance with some embodiments.

FIG. 10 is an exploded view of a thin-film deposition system 1000, according to some embodiments. The thin-film deposition system 1000 includes a base 116 a lid 118, a wafer support 104. The wafer support 104 may be coupled to a quartz insulator 192. The quartz insulator 192 is coupled to a lower shield 190. The quartz insulator 190 may be part of the wafer support 104. The thin-film deposition system 1000 includes inner shield 198 and an outer shield 199. The thin-film deposition system 100 includes ceramic pins 194 and 196. The thin-film deposition system 100 includes the bell jar 108 including the zirconium coating 110. A thin-film deposition system 1000 may include other components or configurations without departing from the scope of the present disclosure.

Figure 11:
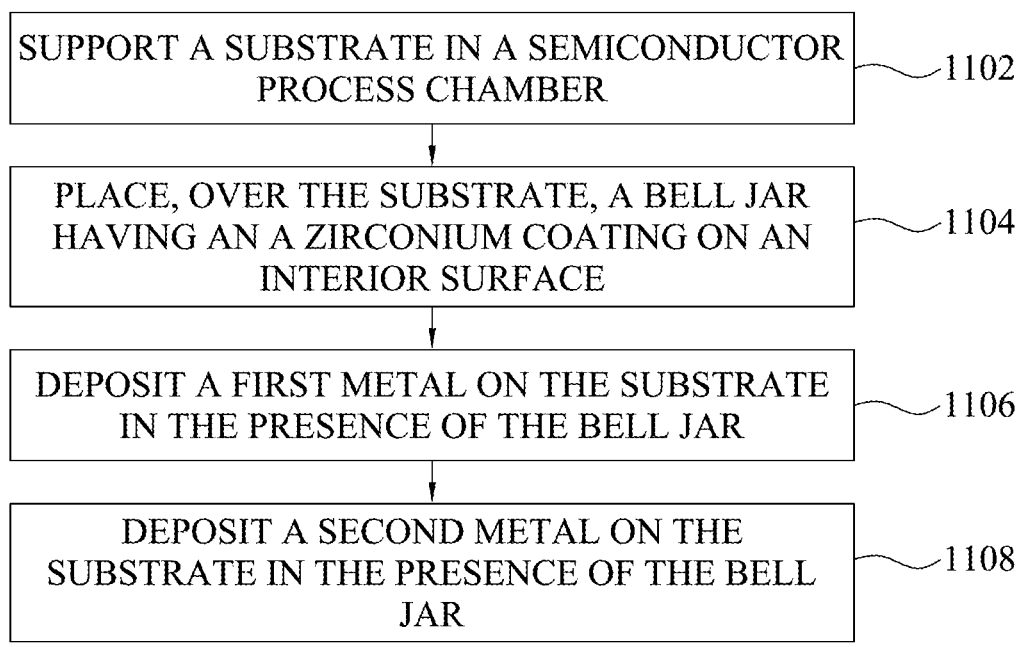
FIG. 11 is a flow diagram of a process for operating a semiconductor process system, in accordance with some embodiments.

FIG. 11 is a flow diagram of a method 1100 for operating a semiconductor process system, according to some embodiments. At 1102, the method 1100 includes supporting a substrate in a semiconductor process chamber. One example of a substrate is the wafer 106 of FIG. 1. One example of a semiconductor process chamber is the process chamber 102 of FIG. 1. At 1104, the method 1100 includes placing, over the substrate, a bell jar having a zirconium coating on an interior surface. One example of a bell jar is the bell jar 108 of FIG. 2. One example of a zirconium coating is the zirconium coating 110 of FIG. 3. At 1106, the method includes depositing a first metal on the substrate in the presence of the bell jar. One example of a first metal is the metal layer 160 of FIG. 6. At 1108, the method includes depositing a second metal on substrate in the presence of the bell jar. One example of a second metal is the metal layer 162 of FIG. 6.

Figure 12:
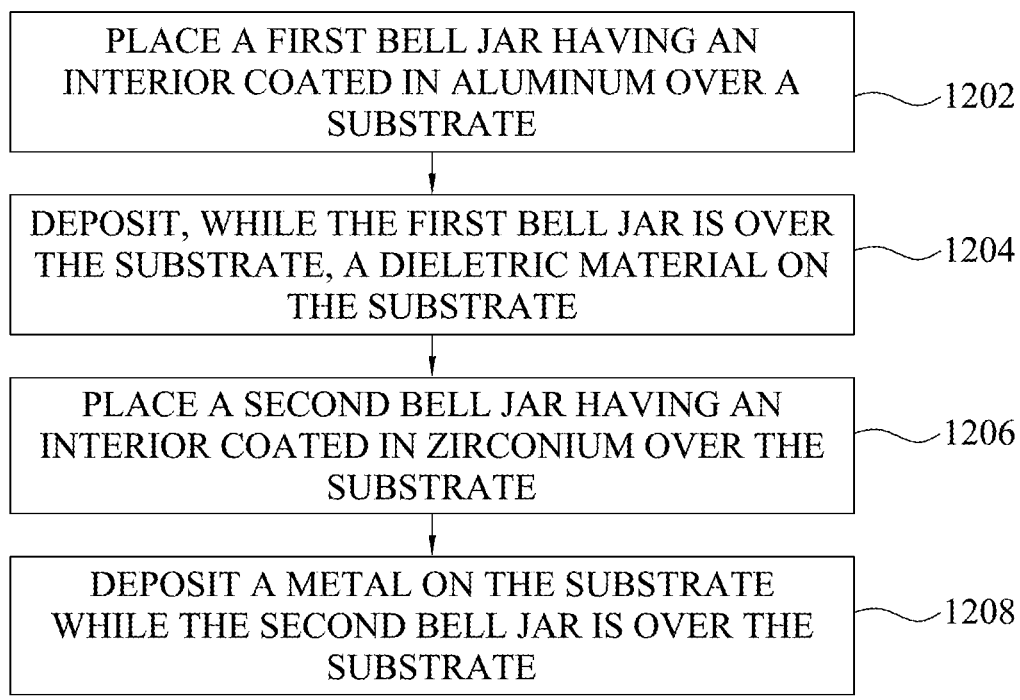
FIG. 12 is a flow diagram of a process for operating a semiconductor process system, in accordance with some embodiments.

FIG. 12 is a flow diagram of a method 1200 for operating a semiconductor process system, according to some embodiments. At 1202, the method 1200 includes placing, over a substrate, a first bell jar having an interior coated in aluminum. One example of a substrate is the wafer 106 of FIG. 1. One example of a first bell jar is the bell jar 138 of FIG. 5. At 1204, the method 1200 includes depositing, while the first bell jar is over the substrate, a dielectric material on the substrate. One example of a dielectric material is the dielectric layer 158 of FIG. 6. At 1206, the method 1200 includes placing, over the substrate, a second bell jar having an interior coated in zirconium over the substrate. One example of a second bell jar is the bell jar 108 of FIG. 2. At 1208, the method 1200 includes depositing a metal on the substrate while the second bell jar is over the substrate. One example of a metal is the metal layer 160 of FIG. 6.

Embodiments of the present disclosure reduce contamination of substrates, such as wafers, in a semiconductor process system. A wafer is supported within a semiconductor process chamber. A bell jar covers the wafer within the semiconductor process chamber. The interior surface of the bell jar is coated with a rough material. The rough material provides superior adhesion to particles or debris that are present within the semiconductor process system while a semiconductor process is performed. When the bell jar is used in a subsequent semiconductor process, the debris or particles from the previous semiconductor process do not fall off of the interior surface of the bell jar and fall onto the wafer because the particles or debris adhere tightly to the rough coating. The result is less contamination of wafers during semiconductor processes. This in turn leads to higher wafer yields and better functioning integrated circuits diced from the wafers.

One embodiment is a method including supporting a substrate in a semiconductor process chamber and placing, over the substrate, a bell jar having a zirconium coating on an interior surface. The method includes depositing a first metal on the substrate in the presence of the bell jar and depositing a second metal on substrate in the presence of the bell jar.

One embodiment is a method including placing, over a substrate, a first bell jar having an interior coated in aluminum and depositing, while the first bell jar is over the substrate, a dielectric material on the substrate. The method includes placing, over the substrate, a second bell jar having an interior coated in zirconium over the substrate and depositing a metal on the substrate while the second bell jar is over the substrate.

One embodiment is a semiconductor process system including a process chamber, a substrate support configured to support a substrate within the process chamber, and a bell jar support. The system includes a bell jar including an interior surface coated in zirconium and configured to cover the substrate support when placed on the bell jar support and deposition equipment configured to deposit a metal on the substrate when the substrate is supported on the substrate support and covered by the bell jar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   supporting a substrate in a semiconductor process chamber;
   placing, over the substrate, a first bell jar having a zirconium coating on an interior surface;
   depositing a first metal on the substrate in the presence of the first bell jar;
   depositing a second metal on the substrate in the presence of the first bell jar;
   placing, over the substrate, a second bell jar having an aluminum coating on an interior surface; and
   depositing a dielectric layer over the second metal in the presence of the second bell jar.

2. The method of claim 1, wherein depositing the first metal includes depositing titanium nitride.

3. The method of claim 2, wherein depositing the second metal includes depositing tantalum nitride.

4. The method of claim 3, further comprising forming a magnetic tunnel junction of a magnetic random access memory cell with the first metal and the second metal.

5. The method of claim 2, wherein the second metal includes copper.

6. The method of claim 1, further comprising placing, over the bell jar, a lid including a radio frequency resonator.

7. The method of claim 5, further comprising depositing the first metal by performing a physical vapor deposition process with the radio frequency resonator.

8. The method of claim 1, wherein the first bell jar is quartz.

9. A method, comprising:
   placing, over a substrate, a first bell jar having an interior coated in aluminum;
   depositing, while the first bell jar is over the substrate, a dielectric material on the wafer;
   placing, over the substrate, a second bell jar having an interior coated in zirconium; and
   depositing a metal on the substrate while the second bell jar is over the substrate.

10. The method of claim 9, wherein the dielectric material includes silicon oxide.

11. The method of claim 9, wherein the metal includes titanium nitride.

12. The method of claim 9, further comprising:
    depositing the dielectric material while the substrate is in a first semiconductor process chamber; and
    depositing the metal layer while the substrate is in a second semiconductor process chamber.

13. The method of claim 9, further comprising depositing the dielectric material and the metal on the substrate while the substrate is in a same deposition chamber.

14. The method of claim 9, comprising depositing the metal on the substrate with a physical vapor deposition process.

15. A semiconductor process system, comprising:
    a process chamber;
    a substrate support configured to support a substrate within the first process chamber;
    a bell jar support;
    a first bell jar including an interior surface coated in zirconium and configured to cover the substrate support when placed on the bell jar support;
    a second bell jar including an interior surface coated in aluminum and configured to cover the support when placed on the bell jar support; and
    deposition equipment configured to:
        deposit a metal on the substrate while the substrate is supported on the substrate support and covered by first the bell jar; and
        deposit a dielectric layer on the metal layer on the substrate while the substrate is supported on the substrate support and covered by second the bell jar.

16. The system of claim 15, wherein the zirconium has a thickness between 100 nm and 5 mm.

17. The system of claim 16, wherein the zirconium has a root mean square surface roughness between 50 nm and 2 µm.

18. The system of claim 17, wherein the deposition equipment includes a lid configured to cover the first bell jar and having a radio frequency coil.

19. The system of claim 18, wherein the radiofrequency coil is configured to assist in performing a physical vapor deposition process to deposit the metal.

20. The system of claim 15, wherein the metal is titanium nitride.

* * * * *